(12) United States Patent
Nakamura et al.

(10) Patent No.: US 11,851,289 B2
(45) Date of Patent: Dec. 26, 2023

(54) CONVEYANCE SYSTEM FOR TRANSFERRING FRAME WAFER

(71) Applicant: Sinfonia Technology Co., Ltd., Tokyo (JP)

(72) Inventors: Hiroaki Nakamura, Tokyo (JP); Toshihiro Kawai, Tokyo (JP); Kosuke Sugiura, Tokyo (JP); Gengoro Ogura, Tokyo (JP); Yasushi Taniyama, Tokyo (JP)

(73) Assignee: Sinfonia Technology Co., Ltd., Tokyo (JP)

( * ) Notice: Subject to any disclaimer, the term of this patent is extended or adjusted under 35 U.S.C. 154(b) by 0 days.

(21) Appl. No.: 17/788,647

(22) PCT Filed: Sep. 23, 2020

(86) PCT No.: PCT/JP2020/035693
§ 371 (c)(1),
(2) Date: Jun. 23, 2022

(87) PCT Pub. No.: WO2021/131186
PCT Pub. Date: Jul. 1, 2021

(65) Prior Publication Data
US 2023/0033168 A1 Feb. 2, 2023

(30) Foreign Application Priority Data
Dec. 27, 2019 (JP) ................................. 2019-238136

(51) Int. Cl.
*H01L 21/677* (2006.01)
*B65G 47/90* (2006.01)
(Continued)

(52) U.S. Cl.
CPC .......... *B65G 47/905* (2013.01); *H01L 21/677* (2013.01); *H01L 21/67259* (2013.01); *H01L 21/68707* (2013.01)

(58) Field of Classification Search
CPC ............. H01L 21/67259; H01L 21/677; H01L 21/68707
See application file for complete search history.

(56) References Cited

U.S. PATENT DOCUMENTS

| 2007/0129827 A1* | 6/2007 | Schauer ............ H01L 21/67259 700/90 |
| 2019/0152721 A1* | 5/2019 | Xu ..................... H01L 21/67724 |
| 2021/0013077 A1 | 1/2021 | Kawai et al. |

FOREIGN PATENT DOCUMENTS

JP 2019161116 A 9/2019

OTHER PUBLICATIONS

International Patent Application No. PCT/JP2020/035693, Search Report (and English translation) and Written Opinion, dated Dec. 1, 2020.

* cited by examiner

*Primary Examiner* — Gerald McClain
(74) *Attorney, Agent, or Firm* — Kilpatrick Townsend & Stockton LLP

(57) ABSTRACT

A conveyance system discriminates the front and back of a frame wafer without human intervention. A frame is partially formed asymmetrically with respect to a predetermined center line when viewed in a direction orthogonal to a surface of a wafer. The conveyance system includes a hand configured to hold the frame so that the frame extends in a predetermined virtual plane, a first sensor configured to detect a portion of the frame held on the hand and located in a predetermined first region in the virtual plane, a second sensor configured to detect a portion of the frame held on the (Continued)

hand and located in a second region opposite to the first region across the center line, and a controller configured to determine the front and back of the frame wafer based on a detection result obtained by the first sensor and a detection result obtained by the second sensor.

8 Claims, 15 Drawing Sheets

(51) Int. Cl.
     *H01L 21/67*          (2006.01)
     *H01L 21/687*        (2006.01)

FIG. 5

| State | First sensor | Second sensor | Determination |
|---|---|---|---|
| A | Undetected | Detected | Substrate present<br><br>First orientation |
| B | Detected | Undetected | Substrate present<br><br>Second orientation |
| C | Detected | Detected | Substrate present<br><br>Undeterminable |
| D | Undetected | Undetected | Substrate absent |

(State A1)

(State B1)

(State C1)

(State D1)

FIG. 8

| State | First sensor | Second sensor | Third sensor | Fourth sensor | Determination |
|---|---|---|---|---|---|
| A1 | Undetected | Detected | Detected | Detected | First orientation Angle 0 |
| B1 | Detected | Undetected | Detected | Detected | Second orientation Angle 0 |
| C1 | Detected | Detected | Undetected | Detected | First orientation Angle 90 |
| D1 | Detected | Detected | Detected | Undetected | Second orientation Angle 90 |

CONVEYANCE SYSTEM FOR TRANSFERRING FRAME WAFER

CROSS-REFERENCE TO RELATED APPLICATIONS

This application is a national phase application of International Patent Application No. PCT/JP2020/035693, filed on Sep. 23, 2020, which claims priority to Japan Patent Application No. 2019-238136, filed on Dec. 27, 2019, both of which are hereby incorporated by reference in their entireties.

TECHNICAL FIELD

The present disclosure relates to a conveyance system for transferring a frame wafer having a wafer and a frame for holding the wafer.

BACKGROUND

In a semiconductor manufacturing process, depending on the processing process, a wafer needs to be transferred or processed in a state in which the wafer is held on a ring-shaped frame through an adhesive tape (hereinafter, such a wafer is referred to as a frame wafer for the sake of convenience of explanation). Further, in recent years, depending on the processing process, it is necessary to improve the cleanliness and productivity more than ever in the handling such as storage and transfer of the frame wafer. There is an increasing demand for the local cleanliness and the device in which the transfer is automated by a robot.

As a conveyance system for transferring a frame wafer, an EFEM (Equipment Front End Module) may be used for transferring a wafer between a container containing wafers and a processing apparatus for performing a predetermined process on the wafer, as described in Patent Document 1. The conveyance system includes a housing, a transfer robot arranged inside the housing, and a load port attached to the outside of the housing and configured so that a container for accommodating a frame wafer is mounted thereon. The transfer robot transfers the frame wafer between the container mounted on the load port and the processing apparatus.

Further, in the conveyance system for the frame wafer, it may be required to turn over (invert) the frame wafer taken out from the container and transfer it to the processing apparatus. In this case, for example, the substrate is inverted by a known inversion device that inverts the frame wafer.

PRIOR ART DOCUMENT

Patent Document

Patent Document 1: Japanese laid-open publication No. 2019-161116

SUMMARY

As mentioned above, when the frame wafer needs to be inverted, for example, if the conveyance system is stopped for some reason, a frame wafer with one side facing upward (front orientation) and a frame wafer with the other side facing upward (back orientation) may coexist in the housing. In such a case, if it is necessary for a worker to check the front and back of the frame wafer in the housing, the worker should enter the housing, which may lead to problems such as troublesome confirmation work, contamination of the internal space of the housing, and the like.

Further, even if it is not necessary to invert the frame wafer, for example, when the frame wafer is put into the container by an operator, there may occur a situation where the operator puts the frame wafer into the container with the front and back sides of the frame wafer kept in a wrong state. In this case, if the frame wafer is processed with the front and back sides kept in a wrong state, production failure or the like may occur.

The present disclosure provides some embodiments of a conveyance system capable of discriminating the front and back of a frame wafer without human intervention.

According to one embodiment of the present disclosure, there is provided a conveyance system for transferring a frame wafer including a wafer and a frame configured to hold the wafer, the frame partially formed asymmetrically with respect to a predetermined center line when viewed in a direction orthogonal to a surface of the wafer, the conveyance system including: a holder configured to hold the frame so that the frame extends in a predetermined virtual plane; a first detector configured to detect a portion, which is located in a predetermined first region in the virtual plane, of the frame held by the holder; a second detector configured to detect a portion, which is located in a second region opposite to the first region across the center line, of the frame held by the holder; and a controller, wherein the controller is configured to determine a front and a back of the frame wafer based on a detection result obtained by the first detector and a detection result obtained by the second detector.

In the present disclosure, the front and back of the frame wafer can be determined using the asymmetry of the frame as follows. First, by means of the holder, one of the mutually asymmetrical portions (referred to as a first portion and a second portion) of the frame is located in the first region, and the other is located in the second region. Next, the controller determines which of the first portion and the second portion is located in the first region, and determines which of the first portion and the second portion is located in the second region. When the first portion is located in the first region and the second portion is located in the second region, it can be determined that the orientation of the frame wafer is a predetermined orientation (first orientation). Conversely, when the second portion is located in the first region and the first portion is located in the second region, it can be determined that the orientation of the frame wafer is a second orientation opposite to the first orientation. As described above, in the conveyance system, the front and back of the frame wafer can be discriminated without human intervention.

In the conveyance system, the first detector is capable of detecting whether or not a portion of the frame held by the holder is located in the first region, the second detector is capable of detecting whether or not a portion of the frame held by the holder is located in the second region, and the controller is configured to, when the frame is not detected by the first detector and is detected by the second detector, determine that the frame wafer has a first orientation, and is configured to, when the frame is detected by the first detector and is not detected by the second detector, determine that the frame wafer has a second orientation opposite to the first orientation.

For example, if the first detector and the second detector are cameras that capture an image of the frame and the controller is configured to determine the shape of the frame by image recognition, the manufacturing cost may increase.

However, in the present disclosure, the front and back of the frame wafer can be discriminated only based on the simple information as to whether or not the frame is detected. Since the front and back sides of the frame wafer can be discriminated by a simple configuration, it is possible to suppress an increase in the manufacturing cost.

The conveyance system further includes: an inversion part configured to invert the front and back of the frame wafer.

In the conveyance system including the inversion part, a frame wafer having a first orientation and a frame wafer having a second orientation may easily coexist. Therefore, in such a configuration, it is particularly effective to be able to determine the front and back of the frame wafer. In addition, the inversion part makes it easy to change the orientation of the frame wafer to a desired orientation.

The conveyance system further includes: a third detector arranged, in the frame held by the holder, at a position shifted from the first detector by a predetermined angle about a predetermined center point in the virtual plane; and a fourth detector arranged, in the frame held by the holder, at a position shifted from the second detector by the predetermined angle about the center point in the virtual plane, wherein the controller is configured to determine the front and back of the frame wafer and an angle in the virtual plane of the frame wafer based on detection results of the first detector, the second detector, the third detector and the fourth detector.

In the present disclosure, in a situation where it is desired to determine not only the front and back of the frame wafer but also the angle in the virtual plane, it is possible to determine the angle without human intervention.

In the conveyance system, the holder is capable of holding, as the frame, a first frame and a second frame having a different shape from the first frame, the system further includes: a first frame detector including the first detector and the second detector and arranged at a position where the first frame detector is capable of detecting the first frame; and a second frame detector arranged at a position where the second frame detector is capable of detecting the second frame, and the controller is configured to determine which one of the first frame and the second frame is held on the holder, based on a detection result obtained by the first frame detector and a detection result obtained by the second frame detector.

In the present disclosure, the first frame and the second frame having different shapes can be distinguished without human intervention. Therefore, for example, different processes can be applied to the frame wafer depending on the type of the frame wafer.

BRIEF DESCRIPTION OF DRAWINGS

FIG. 5 is a table showing the contents of determination according to the states of the frame wafer.

FIG. 8 is a table relating to the determination according to the states of the frame wafer.

DETAILED DESCRIPTION

Figure 1:
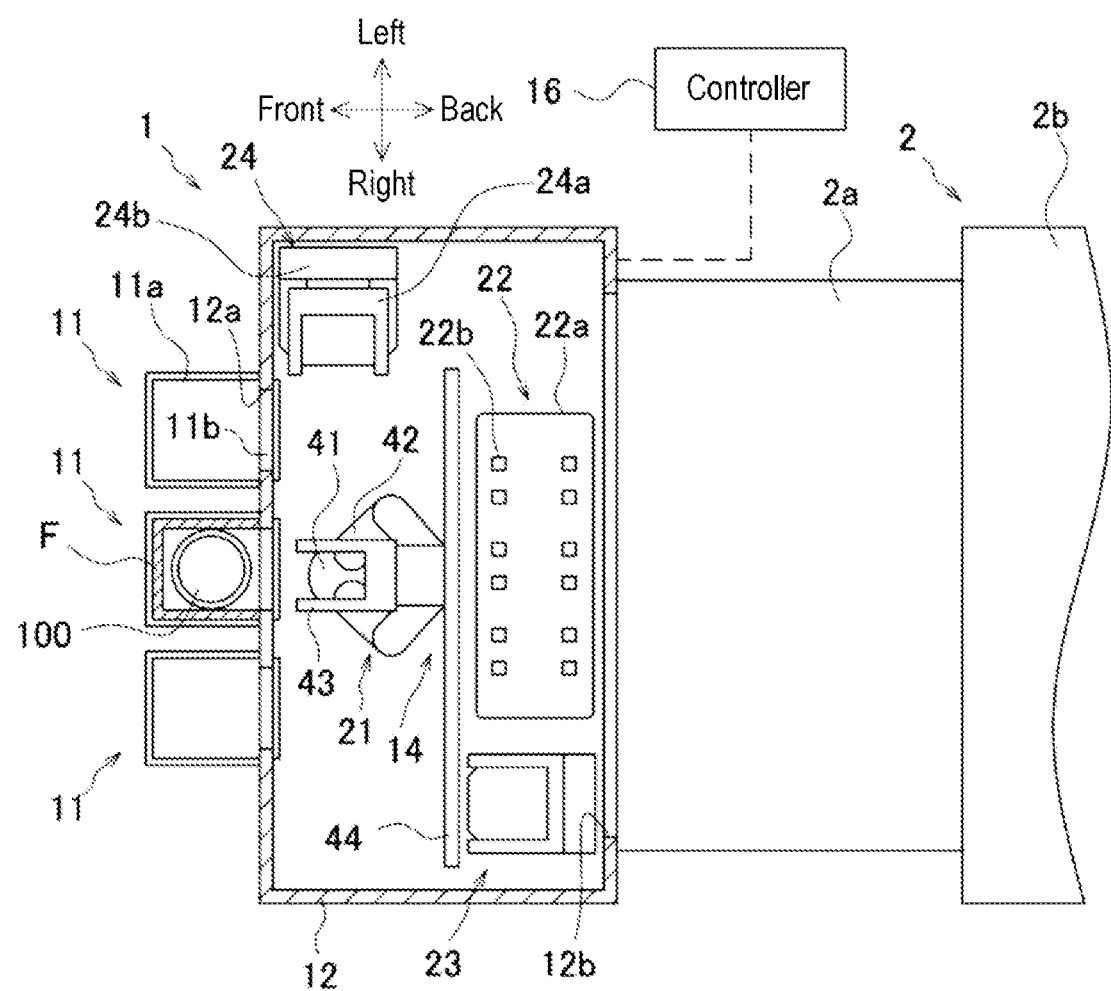
FIG. 1 is a schematic plan view of a conveyance system according to the present embodiment and its surroundings.

Next, an embodiment of the present disclosure will be described. For sake of convenience of explanation, the directions shown in FIG. 1 are defined as a front-back direction and a left-right direction. That is, the direction parallel to the horizontal direction in which the below-described conveyance system 1 and the processing apparatus 2 according to the present embodiment are arranged is defined as a front-back direction. In the front-back direction, the conveyance system 1 side is defined as a front side and the processing apparatus 2 side is defined as a back side. The direction parallel to the horizontal direction and orthogonal to the front-back direction is defined as a left-right direction. In addition, the direction orthogonal to both the front-back direction and the left-right direction is defined as an up-down direction (vertical direction in which gravity acts).

(Conveyance System and Surrounding Configuration)

First, the configuration of the conveyance system 1 and its surrounding configuration will be described with reference to FIG. 1. The conveyance system 1 according to the present embodiment is, for example, a system called EFEM (Equipment Front End Module). The EFEM is a system configured to deliver a frame wafer 100 between a processing apparatus 2 that performs a predetermined process on the frame wafer 100 and a container F in which the frame wafer 100 is accommodated.

Figure 2A:
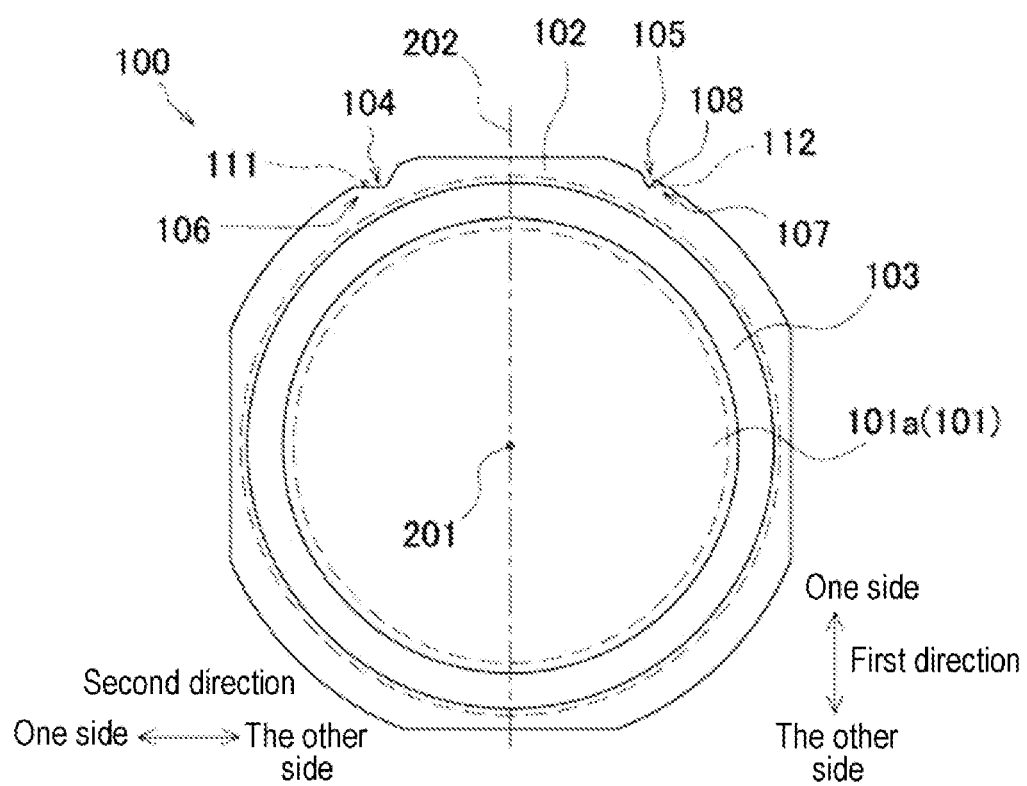
FIGS. 2A and 2B are explanatory views showing a frame wafer.
Figure 2B:
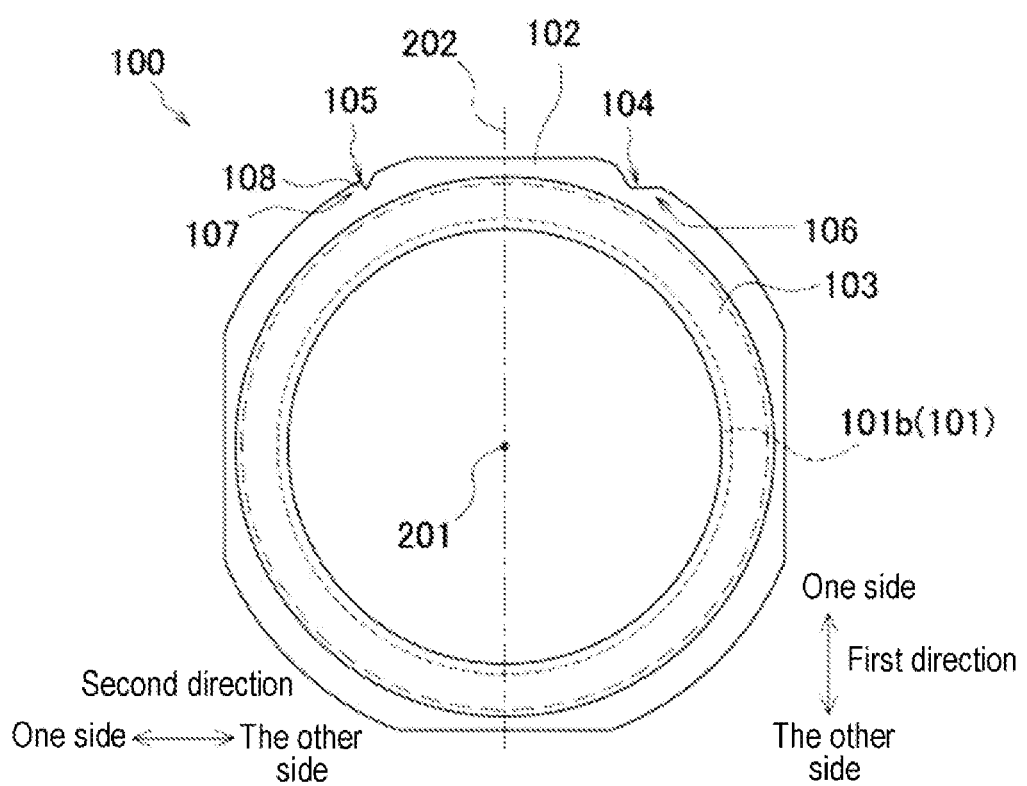

The frame wafer 100 includes a generally disk-shaped wafer 101 which is a substrate having a semiconductor circuit formed thereon, a frame 102 which is a substantially ring-shaped member slightly larger than the wafer 101, and a substantially ring-shaped tape 103 bonded to the frame 102 (see FIGS. 2A and 2B). The wafer 101 is bonded to the tape 103 and is held by the frame 102 via the tape 103. The surface of the wafer 101 on the side not bonded to the tape 103 is referred to as a first surface 101a (see FIG. 2A). Further, the surface of the wafer 101 on the side bonded to the tape 103 is referred to as a second surface 101b (see FIG. 2B).

Further, the container F (see FIG. 1) is a container called FOUP (Front-Opening Unified Pod) and configured to accommodate a plurality of frame wafers 100 arranged in the vertical direction. A lid (not shown) is attached to the side surface of the container F. The container F is transferred in a clean room of a factory by, for example, an OHT (ceiling-travel-type automatic guided vehicle) (not shown) and is mounted on a load port 11 described later.

As shown in FIG. 1, the conveyance system 1 includes a plurality of load ports 11, a housing 12, a transfer part 14, and a controller 16. The conveyance system 1 delivers the frame wafer 100 between the container F mounted on the load port 11 and the processing apparatus 2 by the transfer part 14 provided in the housing 12. The processing apparatus 2 is arranged on the back side of the conveyance system 1. The processing apparatus 2 includes a load lock chamber 2a which is a spare chamber, and a processing part 2b which performs a predetermined process. In the load lock chamber 2a, there is provided a transfer robot (not shown) for moving the frame wafer 100 in the housing 12 into and out of the processing part 2b. The transfer robot may be configured to transfer a plurality of frame wafers 100 at a time or may be configured to transfer only one frame wafer 100.

A plurality of load ports 11 (three, in the present embodiment) is arranged on the front side of the housing 12 and are provided side by side in the left-right direction. The load port 11 is configured to bring the internal space of the container F into communication with the internal space of the housing 12. The load port 11 includes a mounting portion 11a on which the container F is mounted, and a door 11b for opening and closing an opening 12a formed in the front wall portion of the housing 12. The door 11b is configured to be connected to the lid of the container F by a connecting mechanism (not shown). Further, the door 11b is configured to attach and detach the lid to and from the container F by a door moving mechanism (not shown). In a state in which the container F is mounted on the mounting portion 11a of the load port 11, the door 11b is connected to the lid of the container F by the connecting mechanism, and the lid is removed from the container F by the door moving mechanism, so that the internal space of the container F and the internal space of the housing 12 communicate with each other.

The housing 12 is configured to connect the plurality of load ports 11 and the processing apparatus 2 and is formed in a substantially rectangular parallelepiped shape. Inside the housing 12, there is formed a transfer space substantially sealed with respect to the external space and configured to transfer the frame wafer 100. Further, a fan filter unit (not shown) is provided in the transfer space. When the conveyance system 1 is in operation, the gas in the transfer space is basically kept clean by passing through a fan filter. As the gas that fills the transfer space, for example, an air, a dry air, or an inert gas (nitrogen, etc.) is used.

The plurality of load ports 11 is arranged on the front side of the housing 12. A load lock chamber 2a of the processing apparatus 2 is connected to the back side of the housing 12 via an opening 12b formed in the back wall portion of the housing 12.

The transfer part 14 is provided in the housing 12. The transfer part 14 includes a transfer robot 21 that transfers the frame wafer 100, a stage 22 on which the frame wafer 100 is mounted, and a buffer stocker 23 that can temporarily store the frame wafer 100. Further, the transfer part 14 includes an inversion device 24 (inversion part of the present disclosure) for inverting the frame wafer 100.

The transfer robot 21 is configured to be able to transfer the frame wafer 100. The transfer robot 21 includes a main body portion 41, an arm portion 42, and a hand 43. The main body portion 41 is arranged on the front side of the stage 22 and the buffer stocker 23. The main body portion 41 is configured to be movable in the left-right direction by a moving mechanism (not shown) along a rail 44 extending in the left-right direction.

The arm portion 42 is configured by connecting a plurality of arms so as to be rotatable about a vertical axis. The base end portion of the arm portion 42 is attached to the main body portion 41. A substantially U-shaped hand 43 (holder of the present disclosure) is attached to the tip end portion of the arm portion 42. The hand 43 is attached to the tip end portion of the arm portion 42 and is configured to be rotatable about a vertical axis. The hand 43 is configured to be able to hold the frame 102 of the frame wafer 100 by, for example, a mechanical chucking method. The chucking method is not limited thereto. The hand 43 may hold the frame 102 by, for example, a vacuum suction method. Further, in the transfer robot 21, the hand 43 may be provided on each of a plurality of arm portions 42. That is, the transfer robot 21 may be configured to be able to transfer two or more frame wafers 100 at one time.

The stage 22 is arranged on the back side of the transfer robot 21. The stage 22 includes a flat plate 22a elongated in the left-right direction. A plurality of pins 22b for supporting the frame wafer 100 is provided on the upper surface of the flat plate 22a. As a result, a plurality of frame wafers 100 can be mounted side by side in the left-right direction on the stage 22. The frame wafer 100 on the stage 22 can be accessed by, for example, a transfer robot (not shown) in the load lock chamber 2a. In the present embodiment, the stage 22 is configured to support three frame wafers 100 side by side. The number of frame wafers 100 that can be supported by the stage 22 is not limited thereto.

The buffer stocker 23 is arranged so as to be adjacent to the stage 22. The buffer stocker 23 is configured to temporarily store a plurality of frame wafers 100 in order to improve the transfer efficiency.

The inversion device 24 includes a holder 24a for holding, for example, one frame wafer 100 and a motor 24b for rotating the holder 24a about a horizontal axis. The inversion device 24 inverts the frame wafer 100 held by the holder 24a about the horizontal axis using the center line 202 of the frame wafer 100 (see FIG. 2A) as the center of the rotation axis (that is, the inversion device 24 inverts the front and back of the frame wafer 100).

In the transfer part 14 having the above configuration, the transfer robot 21 takes out the frame wafer 100 from the container F and transfers it to the inversion device 24. After the inversion device 24 inverts the frame wafer 100, the transfer robot 21 transfers the frame wafer 100 to the stage 22 or the buffer stocker 23. Further, the transfer robot 21 transfers the frame wafer 100 on the stage 22 or the frame wafer 100 in the buffer stocker 23 to the inversion device 24. After the inversion device 24 inverts the frame wafer 100 (returns the frame wafer 100 to its original orientation), the transfer robot 21 returns the frame wafer 100 to the container F. In this way, the transfer robot 21 carries the frame wafer 100 into and out of the container F.

The controller 16 is, for example, a general computer device, and is, for example, an EFEM HOST that controls the transfer of the frame wafer 100.

The conveyance system 1 having the above configuration takes out the frame wafer 100 from the container F by the transfer robot 21 of the transfer part 14 and transfers it to the inversion device 24. The inversion device 24 inverts the frame wafer 100. The transfer robot 21 transfers the inverted frame wafer 100 to the stage 22 or the buffer stocker 23. The processing apparatus 2 uses a transfer robot (not shown) to move the frame wafer 100 mounted on the stage 22 into and out of the processing part 2b. Further, the transfer robot 21 transfers the frame wafer 100 on the stage 22 returned from the processing apparatus 2 to the inversion device 24. The inversion device 24 returns the frame wafer 100 to its original orientation. Finally, the transfer robot 21 returns the frame wafer 100, which has been returned to its original orientation, to the container F. Thereafter, the container F is transferred by an OHT (not shown).

In this regard, for example, when the conveyance system 1 is stopped due to some trouble, the frame wafer 100 in which the first surface 101a of the wafer 101 faces upward and the frame wafer 100 in which the second surface 101b of the wafer 101 faces upward may coexist in the housing 12. In such a case, when restarting the conveyance system 1, if it is necessary for a worker to check the orientation of the frame wafer 100, the worker should enter the housing 12, which may lead to problems such as troublesome confirmation work, contamination of the internal space of the housing 12, and the like. Therefore, in order to make it possible to discriminate the front and back of the frame wafer 100 without human intervention, the conveyance system 1 has the configuration which will be described below in detail.
(Frame Shape)

Before explaining the detailed configuration of the conveyance system 1, the shape of the frame 102 according to the present embodiment will be described with reference to FIGS. 2A and 2B. FIGS. 2A and 2B are views of the frame wafer 100 as viewed in a direction orthogonal to the surface of the wafer 101. More specifically, FIG. 2A is a view of the frame wafer 100 as viewed from the first surface 101a side. FIG. 2B is a view of the frame wafer 100 as viewed from the second surface 101b side. The up-down direction on the paper surface in FIGS. 2A and 2B is defined as a first direction. The upper side on the paper surface in FIG. 2A is defined as one side in the first direction, and the lower side on the paper surface in FIG. 2A is defined as the other side in the first direction. The left-right direction on the paper surface in FIGS. 2A and 2B is defined as a second direction. The left side on the paper surface in FIG. 2A is defined as one side in the second direction, and the right side on the paper surface in FIG. 2A is defined as the other side in the second direction.

The frame 102 is partially formed asymmetrically with respect to a virtual center line 202 that passes through the center point 201 of the wafer 101 and extends in the first direction when viewed in a direction orthogonal to the surface of the wafer 101. Specifically, at the one end of the frame 102 in the first direction, a notch 104 is formed on one side in the second direction from the center line 202. Further, at the one end of the frame 102 in the first direction, a notch 105 having a shape different from that of the notch 104 is formed on the other side in the second direction from the center line 202. The portion of the frame 102 in which the notch 104 is formed (hereinafter referred to as a first portion 106) is largely cut out as compared with the portion in which the notch 105 is formed (hereinafter referred to as a second portion 107). For example, the first portion 106 is flat in the second direction. On the other hand, the second portion 107 is not flat in the second direction. The second portion 107 is formed with a protrusion 108 protruding to one side in the first direction. The first portion 106 and the second portion 107 are arranged on the opposite sides of the center line 202 and at the positions substantially equidistant from the center line 202 in the second direction.

(Detailed Configuration of Transport System)

Figure 3A:
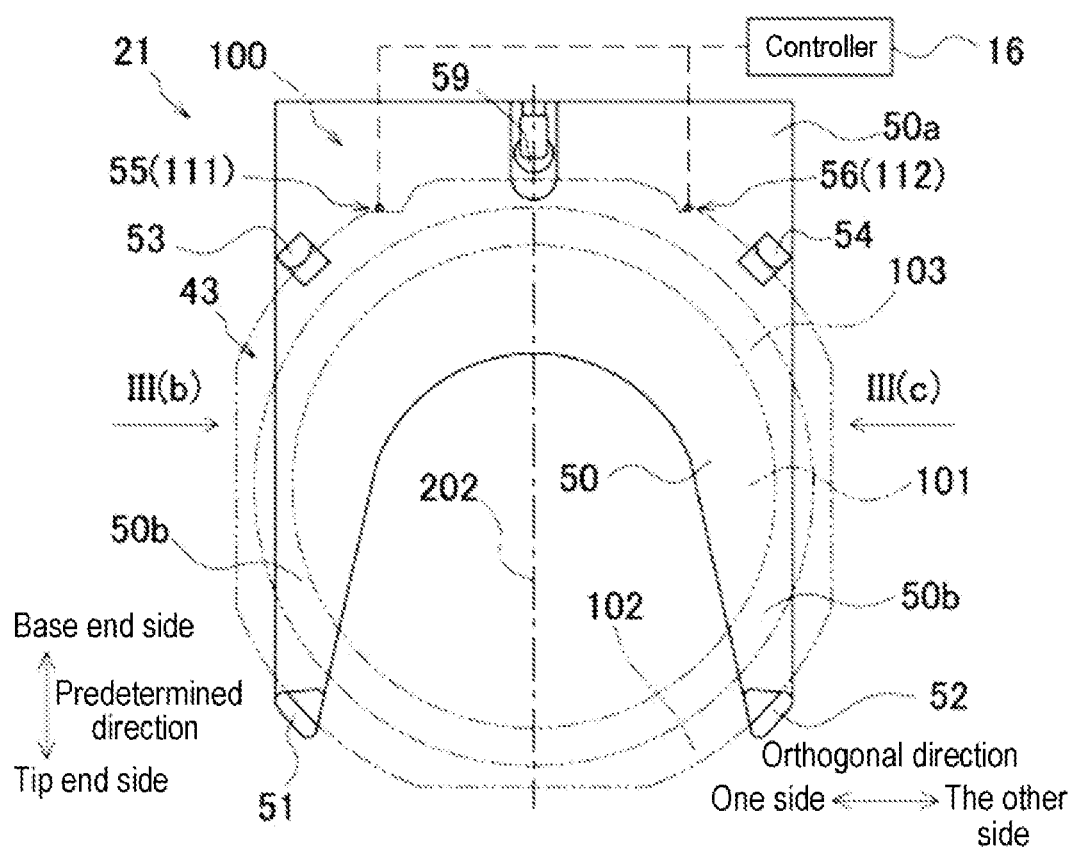
FIGS. 3A to 3C are explanatory views showing a transfer robot.
Figure 3B:
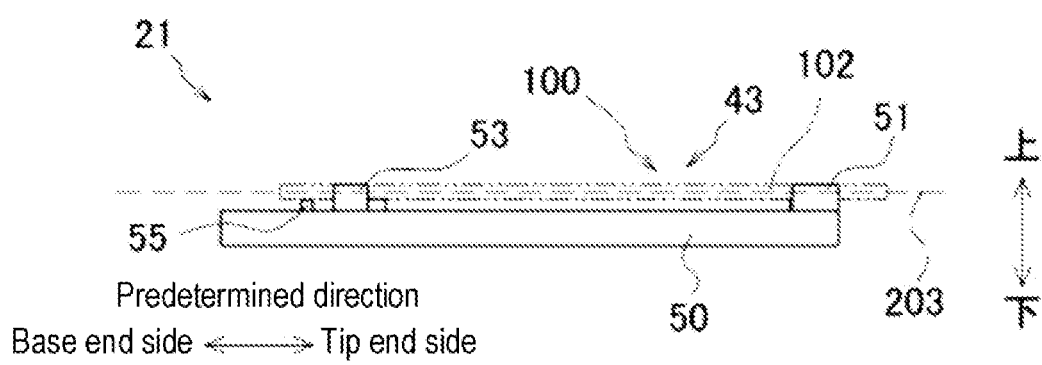
Figure 3C:
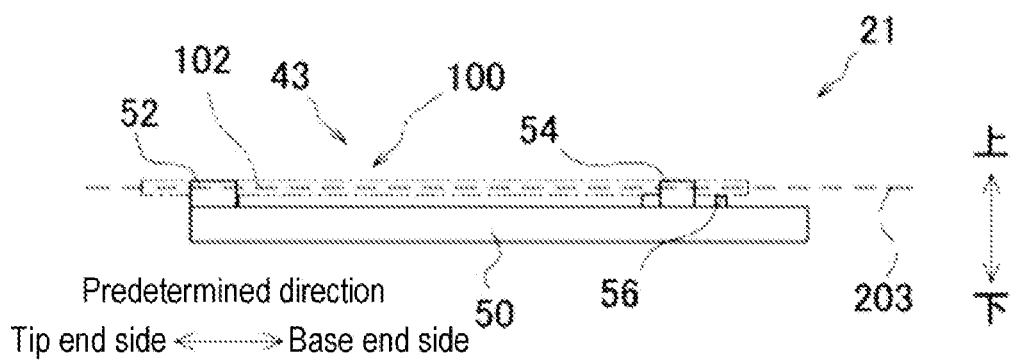

Next, the detailed configuration of the conveyance system 1 (particularly, the transfer robot 21) will be described with reference to FIGS. 3A to 3C. FIG. 3A is a plan view of the hand 43 of the transfer robot 21. FIG. 3B is a view seen from arrow III (b) in FIG. 3A. FIG. 3C is a view seen from arrow III (c) in FIG. 3A. As shown in FIG. 3A, the hand 43 of the transfer robot 21 includes a main body member 50, positioning members 51, 52, 53 and 54, a first sensor 55 (first detector of the present disclosure), and a second sensors 56 (second detector of the present disclosure).

As shown in FIG. 3A, the main body member 50 is a member having a substantially U-shape in a plan view and has a base end portion 50a and two tip end portions 50b. The base end portion 50a is attached to the tip end portion of the arm portion 42 (see FIG. 1). The two tip end portions 50b extend in a predetermined direction from the base end portion 50a. Hereinafter, the base end portion 50a side in the predetermined direction is referred to as a base end side, and the tip end portion 50b side in the predetermined direction is referred to as a tip end side. Further, the direction orthogonal to the predetermined direction is defined as an orthogonal direction. In the orthogonal direction, the left side on the paper surface in FIG. 3A is defined as one side, and the right side on the paper surface in FIG. 3A is defined as the other side.

Each of the positioning members 51 to 54 has a mounting portion on which the frame 102 of the frame wafer 100 is mounted, and a protrusion protruding upward from a part of the mounting portion to restrict the movement of the frame 102. The positioning members 51 to 54 are fixed to the main body member 50. The positioning members 51 and 52 are arranged at the tip end portions 50b of the main body member 50, and the positioning members 53 and 54 are fixed to the base end portion 50a of the main body member 50. The positioning members 51 and 53 are arranged on one side of the main body member 50 in the orthogonal direction, and the positioning members 52 and 54 are arranged on the other side of the main body member 50 in the orthogonal direction. Further, a pressing member 59 that can move in a predetermined direction and can press the frame 102 by being pressed toward the tip end side in the predetermined direction is provided between the positioning member 53 and the positioning member 54 in the orthogonal direction. By the positioning members 51 to 54 and the pressing member 59, the frame 102 is held on the hand 43 so as to extend in a predetermined substantially horizontal virtual plane 203 (see FIGS. 3B and 3C). When the frame wafer 100 is held on the hand 43, the center line 202 of the frame wafer 100 extends along a predetermined direction and lies at the center portion of the hand 43 in the orthogonal direction.

As shown in FIG. 3A, the first sensor 55 is attached to a portion of the main body member 50 on the base end side in the predetermined direction and on one side in the orthogonal direction. The first sensor 55 is provided so as to be arranged below the frame wafer 100 mounted on the hand 43. The first sensor 55 may be, for example, a known reflection type optical sensor or a known contact sensor. The first sensor 55 can detect whether or not a portion of the frame 102 held on the hand 43 is located in a very small first region 111 (see FIGS. 2A and 3A) in the virtual plane 203. The first sensor 55 is electrically connected to the controller 16 to transmit a detection signal to the controller 16.

The second sensor 56 is a sensor having the same configuration as the first sensor 55. As shown in FIG. 3A, the second sensor 56 is attached to a portion of the main body member 50 on the base end side in the predetermined direction and on the other side in the orthogonal direction. The second sensor 56 is provided at a position substantially symmetrical to the first sensor 55 with the center of the main body member 50 in the orthogonal direction interposed therebetween. In other words, the second sensor 56 is provided at a position opposite to the first sensor 55 with the center line 202 of the frame wafer 100 held on the hand 43 interposed therebetween. The second sensor 56 can detect whether or not a portion of the frame 102 held on the hand 43 is located in a very small second region 112 (see FIGS. 2A and 3A) in the virtual plane 203. The second sensor 56 is electrically connected to the controller 16 to transmit a detection signal to the controller 16.

(Determination of Front and Back of Frame Wafer)

Next, a method of determining the front and back of the frame wafer 100 using the conveyance system 1 having the above configuration will be described with reference to FIGS. 4A to 4D. FIGS. 4A to 4D are explanatory views showing the states (orientations) of the frame wafer 100. FIG. 5 is a table showing the contents of determination according to the states of the frame wafer. The vertical direction on the paper surface in FIGS. 4A to 4D is the up-down direction. In the following description, it is assumed that at least the controller 16 and the transfer robot 21 can operate normally, for example, even after the conveyance system 1 is stopped due to some trouble.

Figure 4A:
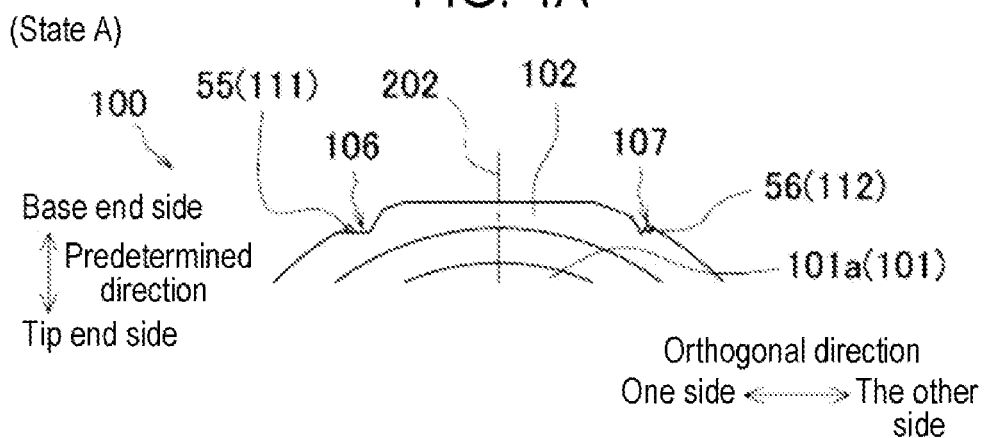
FIGS. 4A to 4D are explanatory views showing the states of the frame wafer.

When the frame wafer 100 is placed on the hand 43 of the transfer robot 21, the controller 16 determines the state (front and back) of the frame wafer 100 as follows. As shown in FIG. 4A, when the first surface 101a of the wafer 101 is facing upward (state A), the first portion 106 of the frame 102 is located around the first region 111, and the second portion 107 is located around the second region 112. More specifically, the frame 102 is not present in the first region 111, and the protrusion 108 of the frame 102 is present in the second region 112.

Since the frame 102 is not present in the first region 111 in the state A, the frame 102 is not detected by the first sensor 55. In this case, the controller 16 determines that the frame 102 is not detected by the first sensor 55 (Undetected) (see FIG. 5). Further, since the protrusion 108 of the frame 102 is present in the second region 112, the frame 102 is detected by the second sensor 56. In this case, the controller 16 determines that the frame 102 is detected by the second sensor 56 (Detected) (see FIG. 5). That is, in the state A, the frame 102 is not detected by the first sensor 55 and is detected by the second sensor 56. At this time, the controller 16 determines that the frame wafer 100 is present on the hand 43 (Substrate present) and the first surface 101a is facing upward (First orientation).

Figure 4B:
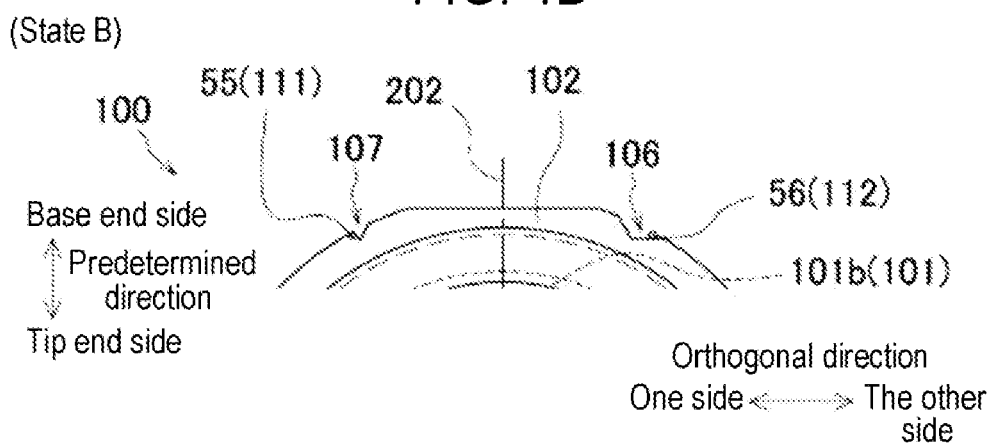

Further, as shown in FIG. 4B, when the second surface 101b of the wafer 101 is facing upward (state B), the first portion 106 of the frame 102 is located in the vicinity of the second region 112. Further, the second portion 107 is located in the vicinity of the first region 111. At this time, contrary to the case of the state A, the frame 102 is detected by the first sensor 55 and is not detected by the second sensor 56. Therefore, the controller 16 determines that the frame wafer 100 is present on the hand 43 (Substrate present) and the second surface 101b is facing upward (Second orientation opposite to the first orientation). In this way, the controller 16 determines the front and back of the frame wafer 100 based on the detection result obtained by the first sensor 55 and the detection result obtained by the second sensor 56.

Figure 4C:
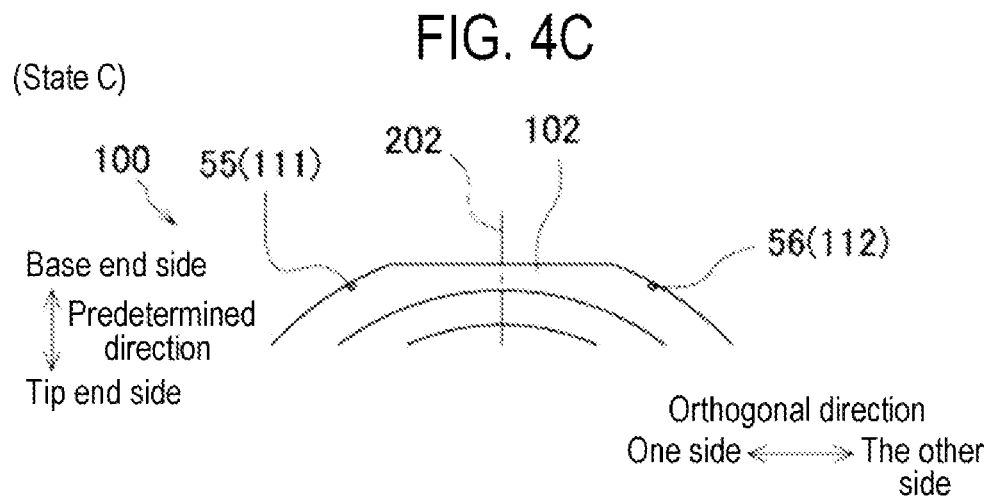
Figure 4D:
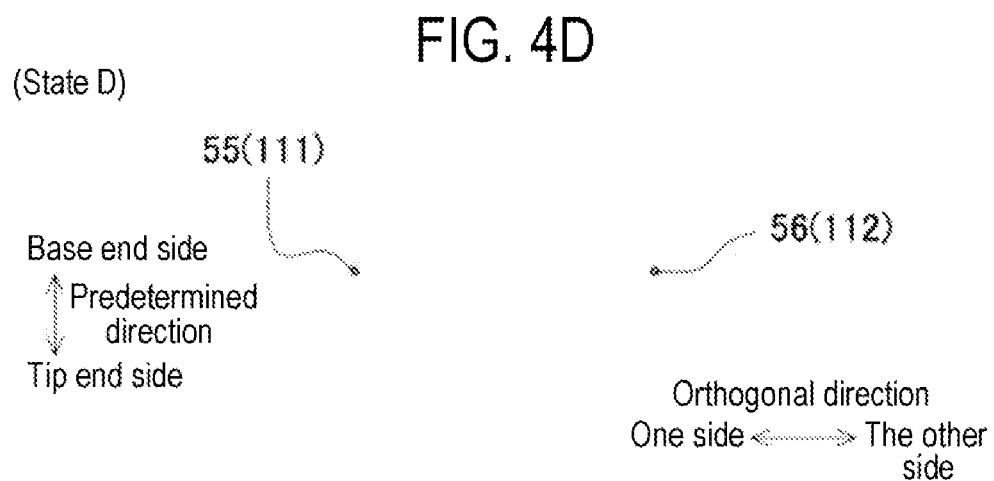

When the frame 102 is detected by both the first sensor 55 and the second sensor 56 (for example, when the angle of the frame wafer 100 in the virtual plane 203 is deviated as in the state C shown in FIG. 4C), the controller 16 makes the following determination. That is, in such a case, the controller 16 determines that the frame wafer 100 is present on the hand 43, but the front and back of the frame wafer cannot be determined (Undeterminable) (see FIG. 5). Further, when the frame 102 is not detected by either the first sensor 55 or the second sensor 56 (for example, when the frame wafer 100 is not present on the hand 43 as in the state D shown in FIG. 4D), the controller 16 determines that the substrate is absent.

As described above, the front and back of the frame wafer 100 can be determined by utilizing the asymmetry of the frame 102. That is, the controller 16 determines which of the first portion 106 and the second portion 107 is located in the first region 111 and determines which of the first portion 106 and the second portion 107 is located in the second region 112. When the first portion 106 is located in the first region 111 and the second portion 107 is located in the second region 112, the controller 16 can determine that the orientation of the frame wafer 100 is the first orientation. On the contrary, when the second portion 107 is located in the first region 111 and the first portion 106 is located in the second region 112, the controller 16 can determine that the orientation of the frame wafer 100 is in the second orientation. As described above, in the conveyance system 1, the front and back of the frame wafer 100 can be discriminated without human intervention.

Further, the front and back of the frame wafer 100 can be discriminated only based on simple information as to whether or not the frame 102 is detected by the first sensor 55 and the second sensor 56. Since the front and back of the frame wafer 100 can be discriminated by a simple configuration, it is possible to suppress an increase in the manufacturing cost.

Further, in the conveyance system 1 provided with the inversion device 24, the frame wafer 100 having the first orientation and the frame wafer 100 having the second orientation may easily coexist. Therefore, in such a configuration, it is particularly effective to be able to determine the front and back of the frame wafer 100. In addition, the inversion device 24 can easily change the orientation of the frame wafer 100 to a desired orientation.

Next, modifications in which the above-described embodiment is modified will be described. The same configurations as those of the above-described embodiment are designated by like reference numerals, and the description thereof will be omitted as appropriate.

Figure 6:
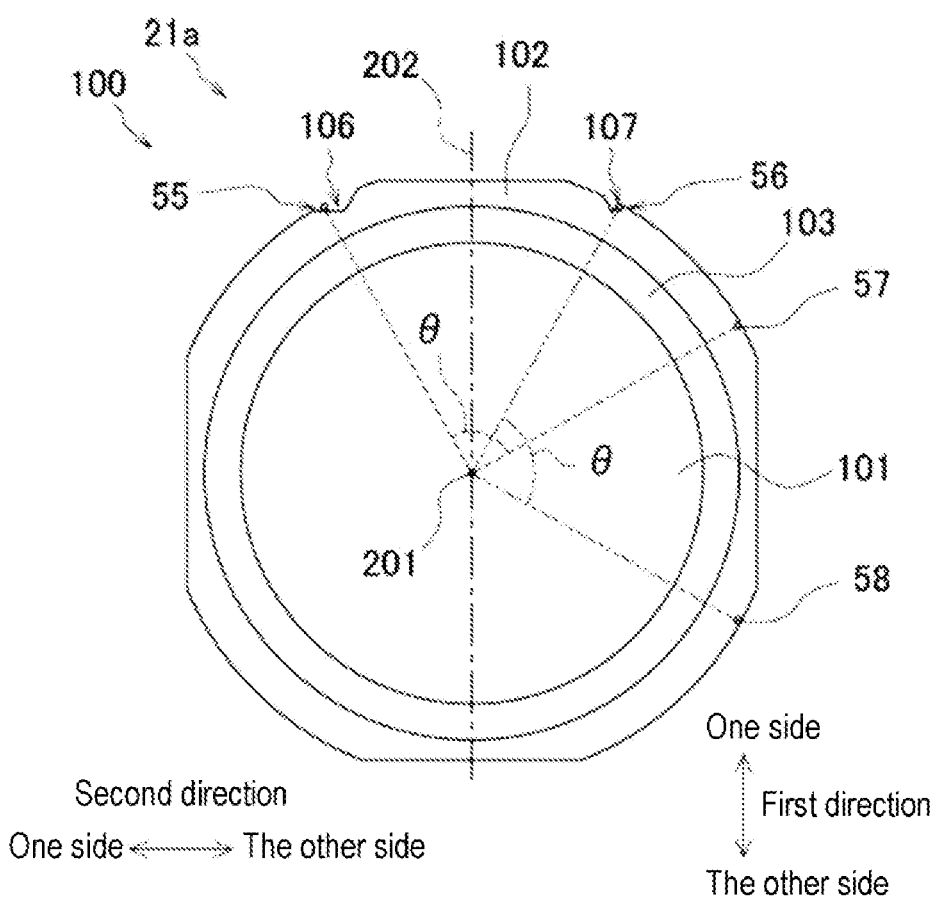
FIG. 6 is an explanatory view showing a frame wafer according to a modification and a sensor.

(1) In the above-described embodiment, the controller 16 determines the front and back of the frame wafer 100 based on the detection results of the first sensor 55 and the second sensor 56. In this modification, the angle of the frame wafer 100 in the virtual plane 203 (see FIGS. 3B and 3C) may be further determined. Hereinafter, description will be made with reference to FIGS. 6 to 8. FIG. 6 is an explanatory view showing the arrangement of the frame wafer 100 and the sensors such as the first sensor 55 and the like. FIGS. 7A to 7D are explanatory views showing the states of the frame wafer 100. FIG. 8 is a table relating to the determination according to the states of the frame wafer 100. In FIG. 6, the hand 43 of the transfer robot 21 is not shown in order to make the drawings easier to understand. As shown in FIG. 6, the transfer robot 21a may include, in addition to the first sensor 55 and the second sensor 56, a third sensor 57 (third detector of the present disclosure) and a fourth sensor 58 (fourth detector of the present disclosure) having the same configuration as the first sensor 55 and the second sensor 56. The third sensor 57 is arranged at a position shifted from the first sensor 55 by an angle θ (predetermined angle of the present disclosure) about the center point 201 in the virtual plane 203 (see FIGS. 3B and 3C). In this modification, the angle θ is 90 degrees. The distance between the third sensor 57 and the center point 201 is substantially equal to the distance between the first sensor 55 and the center point 201. The fourth sensor 58 is arranged at a position shifted from the second sensor 56 by the angle θ about the center point 201 in the virtual plane 203. The distance between the fourth sensor 58 and the center point 201 is substantially equal to the distance between the second sensor 56 and the center point 201. The third sensor 57 and the fourth sensor 58 are arranged at positions where the third sensor 57 and the fourth sensor 58 can detect the frame 102, for example, when the first portion 106 of the frame 102 is arranged in the vicinity of the first sensor 55 and the second portion 107 is arranged in the vicinity of the second sensor 56. The third sensor 57 and the fourth sensor 58 are electrically connected to the controller 16.

Figure 7A:
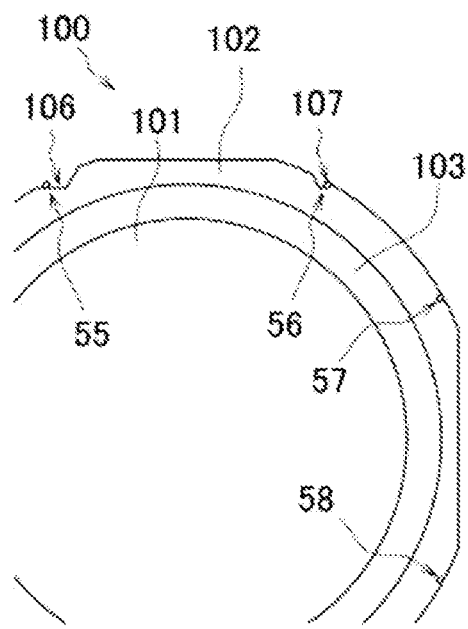
FIGS. 7A to 7D are explanatory views showing the states of the frame wafer.
Figure 7B:
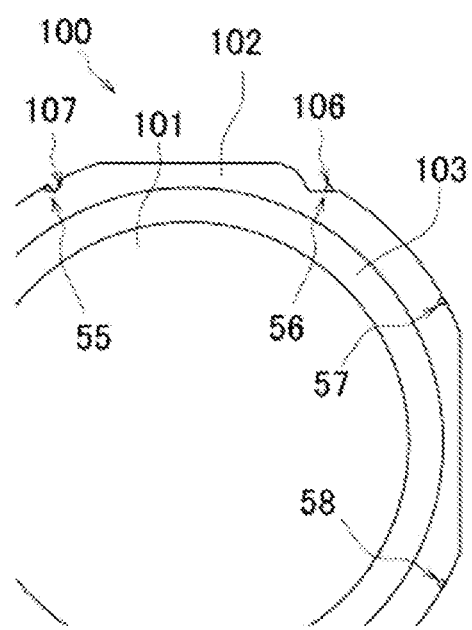
Figure 7C:
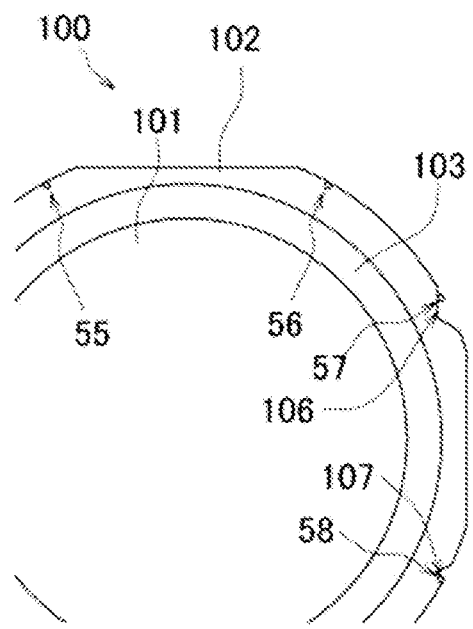
Figure 7D:
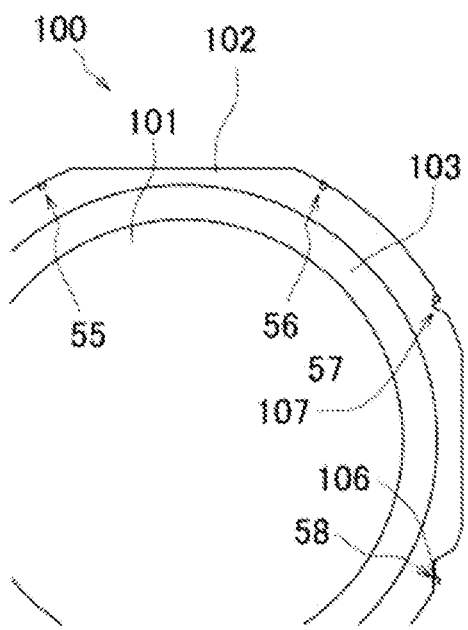

In such a configuration, the controller 16 determines the front and back of the frame wafer 100 and the angle of the frame wafer 100 based on the detection results of the first sensor 55, the second sensor 56, the third sensor 57 and the fourth sensor 58. First, in a state (state A1) in which the frame 102 is not detected by the first sensor 55 but is detected by the second sensor 56, the third sensor 57 and the fourth sensor 58 as shown in FIG. 7A, the controller 16 makes the following determination. That is, the controller 16 determines that the orientation of the frame wafer 100 is the first orientation and the rotation angle of the frame wafer 100 in the virtual plane 203 is 0 degrees (see FIG. 8). Further, in a state (state B1) in which the frame 102 is not detected by the second sensor 56 but is detected by the remaining sensors as shown in FIG. 7B, the controller 16 determines that the orientation of the frame wafer 100 is the second orientation and the rotation angle of the frame wafer 100 is 0 degrees. Further, in a state (state C1) in which the frame 102 is not detected by the third sensor 57 but is detected by the remaining sensors as shown in FIG. 7C, the controller 16 determines that the orientation of the frame wafer 100 is the first orientation and the rotation angle of the frame wafer 100 is 90 degrees. Further, in a state (state D1) in which the frame 102 is not detected by the fourth sensor 58 but is detected by the remaining sensors as shown in FIG. 7D, the controller 16 determines that the orientation of the frame wafer 100 is the second orientation and the rotation angle of the frame wafer 100 is 90 degrees. In this way, in a situation where it is desired to determine not only the front and back of the frame wafer 100 but also the angle of the frame wafer 100 in the virtual plane 203, it is possible to determine the angle without human intervention. In this modification, the angle θ is assumed to be 90 degrees, but the present disclosure is not limited thereto. The angle θ may be any angle. For example, the angle θ may be 180 degrees.

Figure 9:
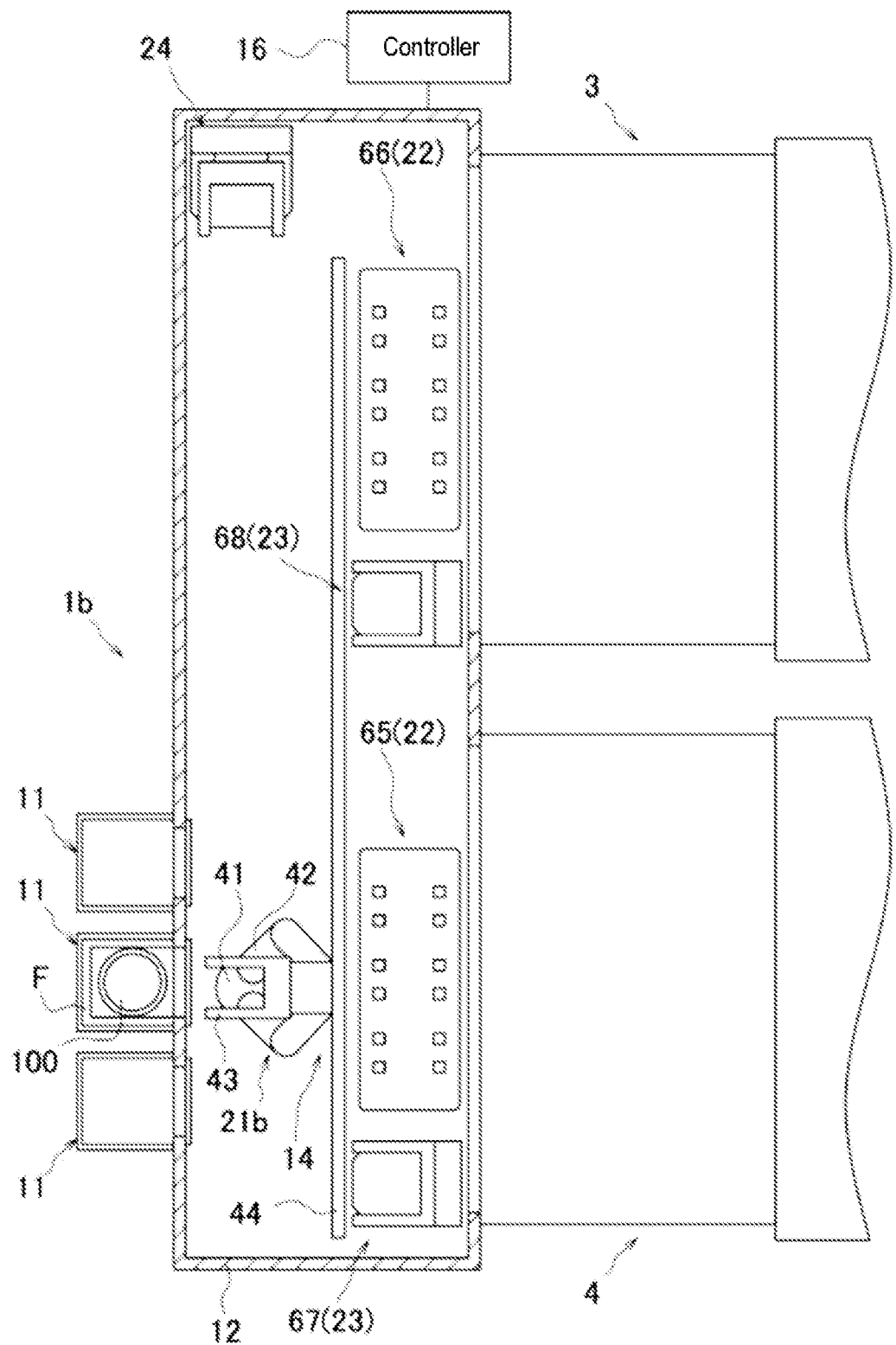
FIG. 9 is a schematic view of a conveyance system according to another modification.
Figure 10A:
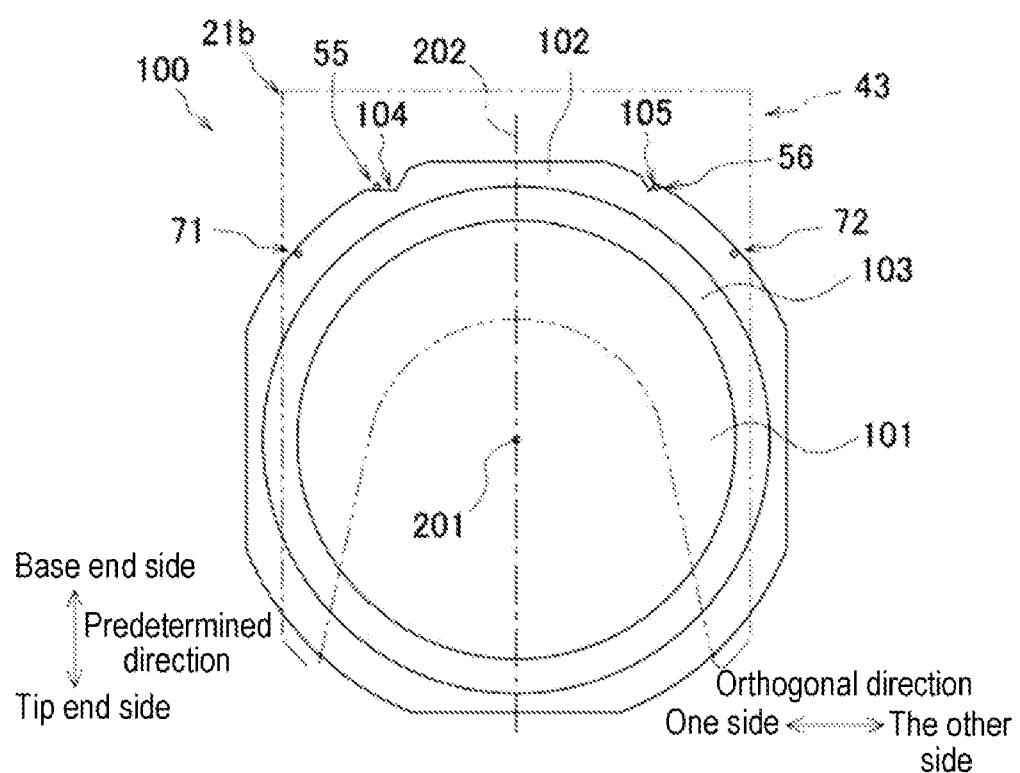
FIGS. 10A and 10B are explanatory views showing a frame wafer and a sensor.
Figure 10B:
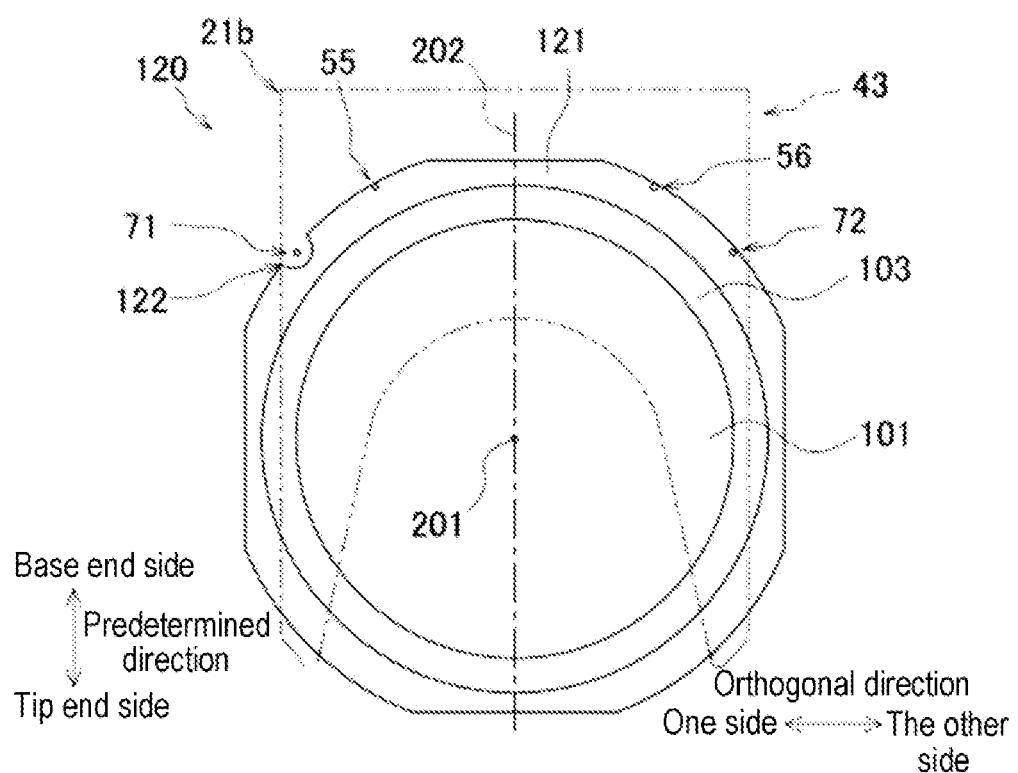

(2) the conveyance system may be configured to, in addition to determining the front and back of the frame wafer 100, determine the type of the frame wafer 100 according to the shape of the frame as will be described later. Hereinafter, description will be made with reference to FIGS. 9, 10A and 10B. FIG. 9 is a schematic view of the conveyance system 1b according to a modification. FIG. 10A is an explanatory view showing the frame wafer 100, a fifth sensor 71 and a sixth sensor 72, which will be described later. FIG. 10B is an explanatory view showing a frame wafer 120, the fifth sensor 71, and the sixth sensor 72, which will be described later. As shown in FIG. 9, two processing apparatuses 3 and 4 are connected to the housing 12 of the conveyance system 1b. In the internal space of the housing 12, stages 22 (stages 65 and 66) and buffer stockers 23 (buffer stockers 67 and 68) are provided on the front sides of the processing apparatuses 3 and 4, respectively. The transfer robot 21b of the transfer part 14 is configured to be able to move the frame wafer 100 and the like between the container F on the load port 11, the stages 22, and the buffer stockers 23.

As shown in FIGS. 10A and 10B, in addition to the first sensor 55 and the second sensor 56 described above, a fifth sensor 71 and a sixth sensor 72 having the same configuration as the first sensor 55 and the second sensor 56 may be provided in the transfer robot 21b. The fifth sensor 71 is provided on one side portion of the hand 43 in the orthogonal direction, and the sixth sensor 72 is provided on the other side portion of the hand 43 in the orthogonal direction. Both the fifth sensor 71 and the sixth sensor 72 are arranged at positions where the fifth sensor 71 and the sixth sensor 72 can detect the frame 102 when the frame wafer 100 is placed on the hand 43 (see FIG. 10A). On the other hand, the fifth sensor 71 and the sixth sensor 72 are arranged so that when the frame wafer 120 (see FIG. 10B) is placed on the hand 43, one of the fifth sensor 71 and the sixth sensor 72 does not detect the frame 121, and the other detects the frame 121. As a specific example, in the second direction (see FIGS. 2A and 2B), a notch 122 not formed in the frame wafer 100 is formed on one side portion of the frame 121. Since such a notch 122 is formed, for example, when the orientation of the frame wafer 120 is the first orientation, the fifth sensor 71 does not detect the frame 121, and the sixth sensor 72 detects the frame 121 (see FIG. 10B). Further, the frame 121 is not formed with the notches 104 and 105 formed in the frame 102. Therefore, when the frame wafer 120 is placed on the hand 43, the first sensor 55 and the second sensor 56 detect the frame 121 (see FIG. 10B).

In such a configuration, the controller 16 can determine the type and the front and back of the frame wafer based on the detection results of the first sensor 55, the second sensor 56, the fifth sensor 71 and the sixth sensor 72. That is, when one of the first sensor 55 and the second sensor 56 does not detect the frame and the other detects the frame, the controller 16 determines that the frame 102 is held on the hand 43, and determines the front and back of the frame wafer 100. At this time, the fifth sensor 71 and the sixth sensor 72 detect the frame 102 regardless of whether the orientation of the frame wafer 100 is the first orientation or the second orientation. Therefore, the detection results obtained by the fifth sensor 71 and the sixth sensor 72 do not affect the determination of the front and back of the frame wafer 100. Further, when one of the fifth sensor 71 and the sixth sensor 72 does not detect the frame and the other detects the frame, the controller 16 determines that the frame 121 is held on the hand 43, and determines the front and back of the frame wafer 120. At this time, the first sensor 55 and the second sensor 56 detect the frame 121 regardless of whether the orientation of the frame wafer 120 is the first orientation or the second orientation. Therefore, the detection results obtained by the first sensor 55 and the second sensor 56 do not affect the determination of the orientation of the frame wafer 120. As described above, the frame 102 and the frame 121 having different shapes can be distinguished without human intervention. Therefore, for example, different processes can be applied to the frame wafer depending on the type of the frame wafer. As an example, when it is determined that the frame 102 is held on the hand 43, the controller 16 may cause the transfer robot 21b to transfer the frame wafer 100 to the stage 65 or the buffer stocker 67. Further, when it is determined that the frame 121 is held on the hand 43, the controller 16 may cause the transfer robot 21b to transfer the frame wafer 120 to the stage 66 or the buffer stocker 68. In this modification, the frame 102 corresponds to the first frame of the present disclosure. The frame 121 corresponds to the second frame of the present disclosure. The first sensor 55 and the second sensor 56 correspond to the first frame detector of the present disclosure. The fifth sensor 71 and the sixth sensor 72 correspond to the second frame detector of the present disclosure.

(3) In the above-described embodiment, the controller 16 determines the front and back of the frame wafer 100 based on the detection results obtained by the first sensor 55 and the like. However, the present disclosure is not limited thereto. For example, a known camera may be provided in place of the first sensor 55 or the like, and the controller 16 may determine the front and back of the frame wafer 100 based on the image taken by the camera. In this case, the camera may capture an image of a region wider than the first region 111 or the like.

(4) In the above-described embodiment, the first sensor 55 and the second sensor 56 are arranged at positions line-symmetrical with respect to the center line 202 of the frame wafer 100 held on the hand 43. However, the present disclosure is not limited thereto. The first sensor 55 and the second sensor 56 do not necessarily have to be arranged line-symmetrically with respect to the center line 202 as long as they are arranged at positions where the front and back of the frame wafer 100 can be detected.

(5) In the above-described embodiment, the first sensor 55 and the like are provided on the transfer robot 21. However, the present disclosure is not limited thereto. For example, the first sensor 55 or the like may be provided in the inversion device 24. Alternatively, the first sensor 55 or the like may be provided on the stage 22.

(6) In the above-described embodiment, the wafer 101 is held by the frame 102 via the tape 103. However, the present disclosure is not limited thereto. The wafer 101 may be held by the frame 102, for example, via a film. Alternatively, for example, the frame 102 may be formed of a member that does not contaminate the wafer 101, and the frame 102 may directly hold the wafer 101.

(7) In the above-described embodiment, the conveyance system 1 is assumed to be an EFEM. However, the present disclosure is not limited thereto. The conveyance system 1 may be, for example, a sorter for changing the arrangement order of the frame wafers 100 in the container F in the up-down direction.

Other configurations can be variously modified without departing from the spirit of the present disclosure.

INDUSTRIAL USE OF THE PRESENT DISCLOSURE

The present disclosure can be used as a conveyance system for transferring an object (typically, a wafer held on a frame via an adhesive tape, a film, or the like).

EXPLANATION OF REFERENCE NUMERALS

1: conveyance system, 16: controller, 24: inversion device (inversion part), 43: hand (holder), 55: first sensor (first detector or first frame detector), 56: second sensor (second detector or first frame detector), 57: third sensor (third detector), 58: fourth sensor (fourth detector), 71: fifth sensor (second frame detector), 72: sixth sensor (second frame detector), 100: frame wafer, 101: wafer, 102: frame (first frame), 111: first region, 112: second region, 121: frame (second frame), 201: center point, 202: center line, 203: virtual plane, θ: angle (predetermined angle)

What is claimed is:

1. A conveyance system for transferring a frame wafer including a wafer and a frame configured to hold the wafer, the frame having a notch at one side with respect to a predetermined center line when viewed in a direction orthogonal to a surface of the wafer such that the frame is partially formed asymmetrically with respect to the predetermined center line, the conveyance system comprising:
   a holder configured to hold the frame so that the frame extends in a predetermined virtual plane;
   a first detector configured to detect, in a predetermined first region in the virtual plane, whether the notch is present in the frame held by the holder;
   a second detector configured to detect, in a predetermined second region opposite to the first region across the center line in the virtual plane, whether the notch is present in the frame held by the holder; and
   a controller,
   wherein the controller is configured to determine a front and a back of the frame wafer based on whether the notch is detected by the first detector and whether the notch is detected by the second detector.

2. The conveyance system of claim 1, wherein
   the controller is configured to, when the notch is not detected by the first detector and is detected by the second detector, determine that the frame wafer has a first orientation, and is configured to, when the notch is detected by the first detector and is not detected by the second detector, determine that the frame wafer has a second orientation opposite to the first orientation.

3. The conveyance system of claim 2, further comprising:
   an inversion part configured to invert the front and the back of the frame wafer.

4. The conveyance system of claim 3, further comprising:
   a third detector arranged at a position shifted from the first detector by a predetermined angle about a predetermined center point in the virtual plane and configured to detect whether the notch is present; and
   a fourth detector arranged at a position shifted from the second detector by the predetermined angle about the center point in the virtual plane and configured to detect whether the notch is present,
   wherein the controller is configured to determine the front and the back of the frame wafer and an angle in the virtual plane of the frame wafer based on detection results of the first detector, the second detector, the third detector and the fourth detector.

5. The conveyance system of claim 4, wherein the holder is capable of holding, as the frame, a first frame and a second frame having a different shape from the first frame,
   the conveyance system further comprises: a first frame detector including the first detector and the second detector and arranged at a position where the first frame detector is capable of detecting the first frame; and a second frame detector arranged at a position where the second frame detector is capable of detecting the second frame, and
   the controller is configured to determine which one of the first frame and the second frame is held on the holder, based on a detection result obtained by the first frame detector and a detection result obtained by the second frame detector.

6. The conveyance system of claim 1, further comprising:
   an inversion part configured to invert the front and the back of the frame wafer.

7. The conveyance system of claim 1, further comprising:
   a third detector arranged at a position shifted from the first detector by a predetermined angle about a predetermined center point in the virtual plane and configured to detect the frame; and a fourth detector arranged at a position shifted from the second detector by the predetermined angle about the center point in the virtual plane and configured to detect the frame, wherein the controller is configured to determine the front and the back of the frame wafer and an angle in the virtual plane of the frame wafer based on detection results of the first detector, the second detector, the third detector and the fourth detector.

8. The conveyance system of claim 1, wherein the holder is capable of holding, as the frame, a first frame and a second frame having a different shape from the first frame, the conveyance system further comprises: a first frame detector including the first detector and the second detector and arranged at a position where the first frame detector is capable of detecting the first frame; and a second frame detector arranged at a position where the second frame detector is capable of detecting the second frame, and the controller is configured to determine which one of the first frame and the second frame is held on the holder, based on a detection result obtained by the first frame detector and a detection result obtained by the second frame detector.

* * * * *